United States Patent
Joda et al.

(10) Patent No.: US 9,793,112 B2
(45) Date of Patent: Oct. 17, 2017

(54) METHOD OF MANUFACTURING SEMICONDUCTOR DEVICE AND NON-TRANSITORY COMPUTER-READABLE RECORDING MEDIUM

(71) Applicant: HITACHI KOKUSAI ELECTRIC INC., Tokyo (JP)

(72) Inventors: Takuya Joda, Toyama (JP); Toru Kakuda, Toyama (JP); Masahisa Okuno, Toyama (JP); Hideto Tateno, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/078,253

(22) Filed: Mar. 23, 2016

(65) Prior Publication Data

US 2016/0203976 A1    Jul. 14, 2016

Related U.S. Application Data

(63) Continuation of application No. PCT/JP2014/075870, filed on Sep. 29, 2014.

(30) Foreign Application Priority Data

Oct. 10, 2013 (JP) .................................. 2013-212806

(51) Int. Cl.
*H01L 21/02* (2006.01)
*H01L 21/324* (2006.01)

(52) U.S. Cl.
CPC .. *H01L 21/02337* (2013.01); *H01L 21/02164* (2013.01); *H01L 21/02222* (2013.01);
(Continued)

(58) Field of Classification Search
CPC ......... H01L 21/02109; H01L 21/02225; H01L 21/02329; H01L 21/02334
See application file for complete search history.

(56) References Cited

U.S. PATENT DOCUMENTS

2012/0060752 A1    3/2012    Kiyotoshi et al.
2013/0149462 A1*   6/2013    Liang .................... C23C 16/401
                                                            427/539
(Continued)

FOREIGN PATENT DOCUMENTS

JP    2010-238695 A    10/2010
JP    2012-060000 A     3/2012
(Continued)

OTHER PUBLICATIONS

International Search Report for PCT Publication WO2015/053121; date of ISR Dec. 16, 2014.

*Primary Examiner* — Cheung Lee
(74) *Attorney, Agent, or Firm* — Volpe and Koenig, P.C.

(57) ABSTRACT

To improve the characteristics of a film formed on a substrate, a method of manufacturing a semiconductor device includes: loading a substrate into a processing container, the substrate being provided with a film having a silazane bond, the film being subjected to pre-baking; supplying oxygen-containing gas at a first temperature not higher than the temperature of the pre-baking; and supplying processing gas containing at least any one of steam and hydrogen peroxide at a second temperature higher than the first temperature.

11 Claims, 4 Drawing Sheets

(52) U.S. Cl.
CPC .. *H01L 21/02271* (2013.01); *H01L 21/02282* (2013.01); *H01L 21/02326* (2013.01); *H01L 21/3247* (2013.01)

(56) References Cited

U.S. PATENT DOCUMENTS

2013/0316515 A1 11/2013 Nagahara et al.
2014/0256160 A1 9/2014 Wada et al.

FOREIGN PATENT DOCUMENTS

WO 2012/111729 A1 8/2012
WO 2013/077321 A1 5/2013

\* cited by examiner

METHOD OF MANUFACTURING SEMICONDUCTOR DEVICE AND NON-TRANSITORY COMPUTER-READABLE RECORDING MEDIUM

TECHNICAL FIELD

The present invention relates to a method of manufacturing a semiconductor device, a substrate processing apparatus, and a non-transitory computer-readable recording medium.

RELATED ART

Due to miniaturization of the Large Scale Integrated Circuit (LSI), technical difficulties have been more and more increased in processing technique of controlling leakage current interference between transistor elements. Separation between elements of the LSI has been made by a method in which, which silicon (Si) as a substrate, a gap, such as a groove or a hole, is formed between the elements required to be separated, and an insulator is deposited in the gap. As the insulator, an oxide film is often used, and, for example, a silicon oxide film is used. The silicon oxide film is formed by oxidizing a Si substrate itself, a Chemical Vapor Deposition (CVD) method, and a Spin On Dielectric (SOD) method.

Due to the miniaturization in recent years, to embedding of fine structures, especially embedding an oxide to gap structure that is deep in the vertical direction or narrow in the horizontal direction, the embedding by the CVD method is reaching the technical limit. Because of these circumstances, adoption has been increasing of an embedding method using oxide having fluidity, that is, the SOD. In the SOD, a coating insulation material is used that is called SOG (Spin on glass) containing inorganic or organic components. The material has been adopted in manufacturing of the LSI from before appearance of the CVD oxide film; however, since the processing technique, in which the processing size is in a range from about 0.35 µm to about 1 µm, has not been fine, a modification method after coating has been accepted by performing heat treatment at about 400° C. in a nitrogen atmosphere.

SUMMARY OF INVENTION

Technical Problem

However, the minimum processing size has become less than 50 nm width of semiconductor devices typified by the LSI, DRAM (Dynamic Random Access Memory), and Flash Memory in recent years, and it has become difficult to lower the processing temperature, to achieve improvement of the manufacturing throughput, and to miniaturize while maintaining a high quality.

The present invention aims to provide a technique capable of improving characteristics of a film formed on a substrate, and improving the manufacturing throughput.

Solution to Problem

According to one aspect, provided is a method of manufacturing a semiconductor device including: loading a substrate into a processing container, the substrate being provided with a film having a silazane bond, the film being subjected to pre-baking; supplying oxygen-containing gas to the substrate at a first temperature not higher than the temperature of the pre-baking; supplying processing gas containing at least any one of steam or hydrogen peroxide to the substrate at a second temperature higher than the first temperature.

Further, according to the other aspect, provided is a non-transitory computer-readable recording medium configured to record a program to be executed by a computer, the program including procedures of: loading a substrate into a processing container, the substrate being provided with a film having a silazane bond, the film being subjected to pre-baking; supplying oxygen-containing gas to the substrate at a first temperature not higher than the temperature of the pre-baking; supplying processing gas to the substrate at a second temperature higher than the first temperature.

Advantageous Effects of Invention

With a technique according to the present invention, it becomes possible to improve the characteristics of a film formed on a substrate.

DESCRIPTION OF EMBODIMENTS

Embodiments of the present invention are described below.

When a substrate coated by a film (for example, polysilazane film) containing a silazane bond (—Si—N— bond) is processed with processing liquid and processing gas, multiple foreign matters (particles) are generated on the substrate after processing. In addition, due to generation of the foreign matters, the quality cannot be kept and miniaturization is prevented. Further, associated with these, a processed product ensuring the quality cannot be continuously manufactured, and manufacturing throughput is deteriorated.

It can be inferred that causes of these problems are in following points. The first cause is that, the polysilazane film is formed by coating a polysilazane solution and pre-baking, however, in the pre-baking, a solvent of the polysilazane coating film and impurities cannot be completely removed, and in modifying, the solvent remaining in the polysilazane film is separated, and reaction of discharging into the processing container as outgas and re-adhesion are caused.

The second cause is that, a distribution of molecular weight is generated in the polysilazane, and a low molecular weight polysilazane is separated from the coated film, and reaction of discharging into the processing container as outgas, re-adhesion, and reaction with the remaining solvent are caused, and as a result, the low molecular weight polysilazane adheres to the substrate surface as a SiO foreign matter or impurities. The third cause is that, impurities contained in the processing liquid and the solvent remaining in the polysilazane film, and the like react with each other, and a by-product is generated.

Based on these causes, as a result of intensive research, by setting the temperature of preheating before the modification processing of the polysilazane coating film to the temperature during the pre-baking of polysilazane or lower, separation of the low molecular weight polysilazane can be suppressed, and the above-described problems can be solved. In addition, by performing the preheating in an oxygen-containing atmosphere, skeletal structure of the low molecular weight polysilazane can be changed to silicon oxide (Si—O), and separation of the low molecular weight polysilazane can be suppressed, and the above-described problems can be solved.

An Embodiment of the Present Invention

Hereinafter, a preferred embodiment of the present invention is described in detail with reference to the drawings.

(1) Configuration of the Substrate Processing Apparatus

Figure 1:
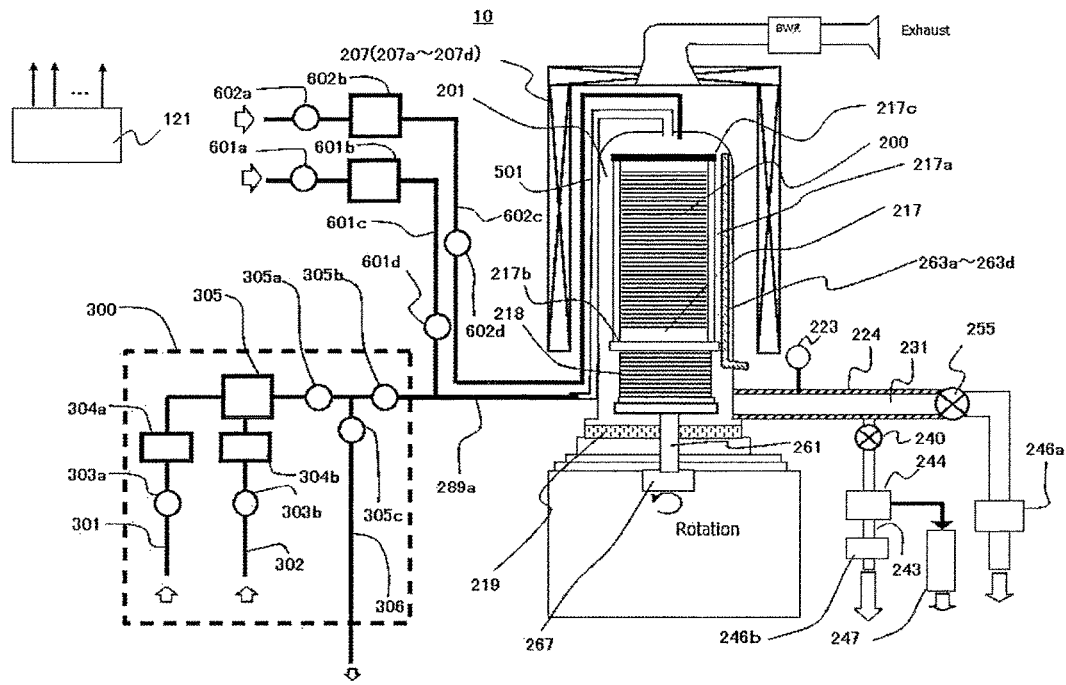
FIG. 1 is a schematic configuration diagram of a substrate processing apparatus according to an embodiment of the present invention.
Figure 2:
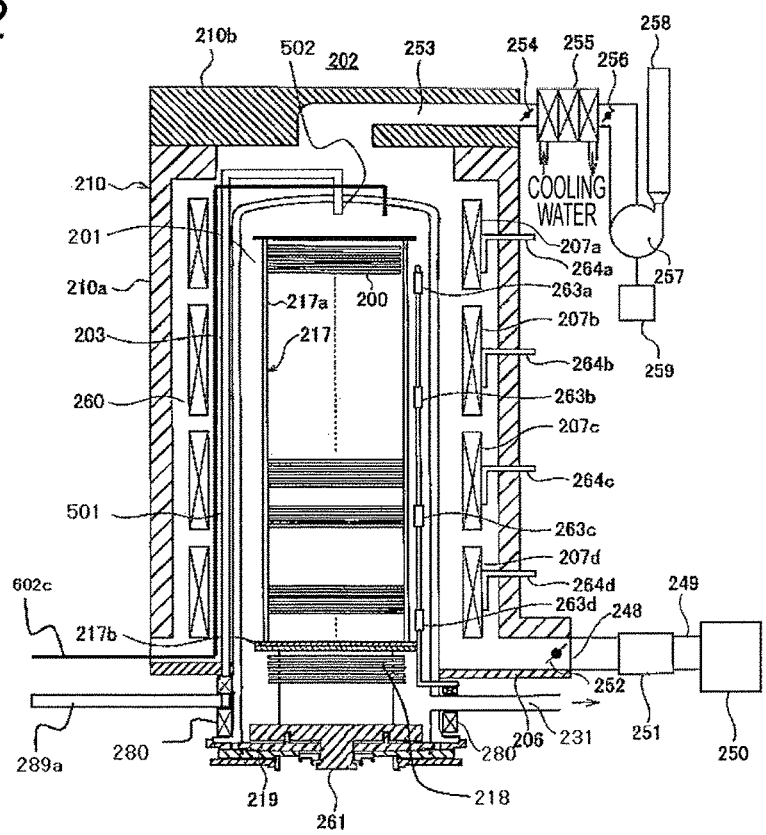
FIG. 2 is a vertical cross-sectional schematic view of a processing furnace included in the substrate processing apparatus according to the embodiment of the present invention.

First, a configuration of the substrate processing apparatus according to the present embodiment is described mainly with reference to FIG. 1 and FIG. 2. FIG. 1 is a schematic configuration diagram of the substrate processing apparatus according to the present embodiment, and illustrates a part of a processing furnace 202 in a vertical cross-sectional view. FIG. 2 is a vertical cross-sectional schematic view of the processing furnace 202 included in the substrate processing apparatus according to the present embodiment.

(Processing Container)

As illustrated in FIG. 1, the processing furnace 202 includes a processing container (reaction tube) 203. The processing container 203 is made of heat-resistant material, such as quartz ($SiO_2$) or silicon carbide (SiC), and is formed in a cylindrical shape whose upper end and lower end are opened. The processing container 203 is configured to have a processing chamber 201 in a cylindrical hollow part, and to be able to accommodate wafers 200 as substrates in a state of being aligned in multiple stages vertically in a horizontal position by a boat 217 as a substrate support unit.

At the lower part of the processing container 203, a seal cap 219 is provided as a furnace port lid capable of airtight seal (closure) of the lower end opening (furnace port) of the processing container (reaction tube) 203. The seal cap 219 is configured to be in contact with the lower end of the processing container 203 from the vertical direction lower side. The seal cap 219 is formed in a disk shape. The substrate processing chamber 201 to be a processing space of the substrates is configured by the processing container 203 and the seal cap 219.

(Substrate Support Unit)

The boat 217 as a substrate holder is configured to be able to hold the multiple wafers 200 in multiple stages. The boat 217 includes multiple support columns 217a for holding the multiple wafers 200. For example, three support columns 217a are provided. Each of the multiple support columns 217a is erected between a bottom plate 217b and a top plate 217c. The multiple wafers 200 are held by the support columns 217a in multiple stages in the tube axis direction in the horizontal position and arranged in a state in which each center is aligned. The top plate 217c is formed to be larger than the maximum diameter of the wafer 200 held by the boat 217.

As constituent material of the support column 217a, bottom plate 217b, top plate 217c, non-metal material having good thermal conductivity is used, for example, silicon oxide ($SiO_2$), silicon carbide (SiC), quartz (AlO), aluminum nitride (AlN), silicon nitride (SiN), zirconium oxide (ZrO). In particular, non-metal material having a thermal conductivity of 10 W/mK or higher is preferable. Incidentally, if the thermal conductivity is not an issue, the substrate support unit can be formed by quartz (SiO) and the like, and if contamination to the wafers 200 by metal is not an issue, the support column 217a, top plate 217c can be formed by metal material such as stainless steel (SUS). When metal is used as the constituent material of the support column 217a, top plate 217c, coating such as ceramic and Teflon (registered trademark) can be formed on the metal.

At the lower part of the boat 217, a heat insulator 218 is provided that is made of heat-resistant material such as quartz and silicon carbide, and the substrate support unit is configured so that heat from a first heating unit 207 is hardly transmitted to the seal cap 219 side. The heat insulator 218 functions as a heat insulation member, and also functions as a holder for holding the boat 217. Incidentally, the heat insulator 218 is not limited to the one provided with multiple heat insulation plates formed in a disk shape in a horizontal position in multiple stages as illustrated, and can be, for example, a quartz cap formed in a cylindrical shape. In addition, the heat insulator 218 can be considered as one of the constituent members of the boat 217.

(Elevation Unit)

Below the processing container 203, a boat elevator is provided as an elevation unit for elevating the boat 217 to convey to the inside and outside of the processing container (reaction tube) 203. The boat elevator is provided with the seal cap 219 for sealing the furnace port when the boat 217 is elevated by the boat elevator.

At an opposite side to the processing chamber 201 of the seal cap 219, a boat rotation mechanism 267 is provided for rotating the boat 217. The boat rotation mechanism 267, whose rotation shaft 261 penetrates the seal cap 219 to be connected to the boat 217, is configured to rotate the wafers 200 by rotating the boat 217.

(First Heating Unit)

Outside the processing container (reaction tube) 203, the first heating unit 207 is provided for heating the wafers 200 in the processing container (reaction tube) 203, concentrically surrounding the side wall surface of the processing container (reaction tube) 203. The first heating unit 207 is provided being supported by a heater base 206. As illustrated in FIG. 2, the first heating unit 207 includes first to fourth heater units 207a to 207d. The first to fourth heater units 207a to 207d are each provided along the stacking direction of the wafers 200 in the processing container (reaction tube) 203.

In the processing container (reaction tube) 203, for each of the first to fourth heater units 207a to 207d as the heating unit, as a temperature detector for detecting the wafers 200 or ambient temperature, for example, first to fourth temperature sensors 263a to 263d of thermocouples and the like are each provided between the processing container (reaction tube) 203 and the boat 217. Incidentally, the first-fourth temperature sensors 263a to 263d each can be provided to detect temperature of the wafer 200 positioned in the center of the multiple wafers 200 each heated by the first to fourth heater units 207a to 207d.

The first heating unit 207, first to fourth temperature sensors 263a to 263d each are electrically connected to a controller 121 described later. The controller 121 is configured to control each supply power to the first to fourth heater units 207a to 207d at predetermined timing so that temperature of the wafer 200 in the processing container (reaction tube) 203 becomes predetermined temperature based on temperature information detected by each of the first to fourth temperature sensors 263a to 263d, and to perform temperature setting and temperature adjustment individually for each of the first to fourth heater units 207a to 207d.

(Gas Supply Unit)

As illustrated in FIG. 1, between the processing container (reaction tube) 203 and the first heating unit 207, a processing gas supply nozzle 501 is provided. The processing gas supply nozzle 501 is formed by, for example, quartz having a low thermal conductivity. The processing gas supply nozzle 501 can have double tube structure. The processing gas supply nozzle 501 is provided along the side part of the outer wall of the processing container (reaction tube) 203. The tip (downstream end) of the processing gas supply nozzle 501 is provided to be airtight at the top (upper end opening) of the processing container (reaction tube) 203. At the tip of the processing gas supply nozzle 501 positioned at the upper end opening of the processing container (reaction tube) 203, a supply hole 502 is provided. A gas supply unit is configured mainly by the processing gas supply nozzle 501 and the supply hole 502. In addition, a purge gas supply unit 601 and a processing gas generation unit 300 described later can be included in the gas supply unit. Further, the gas supply unit can be configured to include an oxygen-containing gas supply unit 602 described later.

The oxygen-containing gas supply unit 602 is configured by valves 602a, 602d, a gas flow rate control unit (mass flow controller) 602b, an oxygen-containing gas supply pipe 602c, and the like, and supplies oxygen-containing gas supplied from an oxygen-containing gas source not illustrated, into the processing container 203. The tip (downstream end) of the oxygen-containing gas supply pipe 602c is provided to be airtight at the top of the processing container 203, and introduces the oxygen-containing gas into the processing container 203. As the oxygen-containing gas, for example, gas is used containing at least one or more of oxygen ($O_2$) gas, ozone ($O_3$) gas, nitric oxide (NO) gas, nitrous oxide ($N_2O$) gas.

The upstream end of the processing gas supply nozzle 501 is connected to the downstream end of the processing gas supply pipe 289a for supplying the processing gas. The processing gas supply pipe 289a is provided with, in order from the upstream direction, the processing gas generation unit 300 and the purge gas supply unit 601 (purge gas supply pipe 601c).

(Processing Gas Generation Unit)

The processing gas generation unit 300 is provided with, from the upstream side, an oxygen-containing gas supply pipe 301, a hydrogen-containing gas supply pipe 302, valves 303a, 303b, gas flow rate control units (mass flow controller; MFC) 304a, 304b, a processing gas generator 305, valves 305a, 305b, 305c. The valve 305c is connected to a drain pipe 306.

The processing gas generator 305 is configured so that, for example, oxygen ($O_2$) gas is supplied from the oxygen-containing gas supply pipe 301 connected to the oxygen-containing gas source not illustrated, and, for example, hydrogen ($H_2$) gas is supplied from the hydrogen-containing gas supply pipe 302 connected to a hydrogen-containing gas source not illustrated. In addition, the oxygen gas being oxygen-containing gas and the hydrogen gas being hydrogen-containing gas supplied to the processing gas generator 305 are burned to generate steam. The steam generated can be supplied into the processing container 203 from the processing gas generation unit.

The purge gas supply unit 601 is configured by purge gas valves 601a, 601d, a purge gas flow rate control unit 601b, a purge gas supply pipe 601c, and the like, and supplies purge gas supplied from a purge gas source not illustrated, into the processing container 203 via the processing gas supply pipe 289a. As the purge gas, for example, gas is used having a low reactivity to the wafers 200 and films formed on the wafers 200. For example, nitrogen ($N_2$) gas or rare gas, such as argon gas, helium gas, neon gas, is used.

(Exhaust Unit)

Below the processing container 203, one end of a gas exhaust pipe 231 is connected for exhausting gas in the substrate processing chamber 201. The other end of the gas exhaust pipe 231 is connected to a vacuum pump 246a (exhaust apparatus) via an APC (Auto Pressure Controller) valve 255 as a pressure regulator. The inside of the substrate processing chamber 201 is exhausted by a pressure gradient generated by a vacuum pump 246. Incidentally, the APC valve 255 is an on-off valve capable of exhaust and exhaust stop of the substrate processing chamber 201 by opening and closing of the valve. In addition, the APC valve 255 is also a pressure adjustment valve capable of pressure adjustment by adjustment of the valve opening. In addition, a pressure sensor 223 as a pressure detector is provided at the upstream side of the APC valve 255. In this way, the exhaust unit is configured to vacuum-exhaust so that the pressure in the substrate processing chamber 201 becomes a predetermined pressure (degree of vacuum). A pressure control unit is electrically connected to the substrate processing chamber 201 and the pressure sensor 223 by the APC valve 255, and the pressure control unit is configured to control at desired timing so that the pressure in the substrate processing chamber 201 becomes a desired pressure by the APC valve 255, based on the pressure detected by the pressure sensor 223.

The exhaust unit is configured by the gas exhaust pipe 231, APC valve 255, pressure sensor 223, and the like. Incidentally, the vacuum pump 246 can be considered to be included in the exhaust unit.

(Second Heating Unit)

When, for example, steam is used as the processing gas, there has been a case in which the steam (water in a gas state) is liquefied by being cooled to the boiling point of water or lower in the processing container 203.

Such liquefaction of steam often occurs in a region other than a region heated by the first heating unit 207 in the processing container 203. Since the first heating unit 207 is provided to heat the wafers 200 in the processing container 203 as described above, the region accommodating the wafers 200 in the processing container 203 is heated by the first heating unit 207. However, the region other than the accommodation region of the wafers 200 in the processing container 203 is hardly heated by the first heating unit 207. As a result, a low temperature region is generated in the region other than the region heated by the first heating unit 207 in the processing container 203, and steam may be liquefied by being cooled when passing through the low temperature region.

Liquid generated by liquefaction of the processing gas may accumulate at the bottom (upper surface of the seal cap 219) in the processing container 203. Because of this, the liquid and the seal cap 219 react with each other, and the seal cap 219 may be damaged.

In addition, when the seal cap 219 is lowered to unload the boat 217 to the outside of the processing container 203 and the furnace port (lower end opening of processing container 203) is opened, if the liquid has accumulated on the seal cap 219, the liquid on the seal cap 219 may fall to the outside of the processing container 203 from the furnace port. Because of this, a furnace port peripheral member of the processing furnace 202 may be damaged, and workers may not be able to safely enter near the processing furnace 202.

Therefore, as illustrated in FIG. 1 and FIG. 2, a second heating unit 280 is provided to heat the region other than the region heated by the first heating unit 207. That is, the second heating unit 280 is provided at the outside (outer periphery) of the lower part of the processing container 203 to concentrically surround the side wall surface of the processing container 203.

The second heating unit 280 is configured to heat the steam flowing to the lower side (downstream side) from the upper side (upstream side) of the processing container 203 toward the exhaust unit at the downstream side in the processing container 203 (that is, a region in which the heat insulator 218 in the processing container 203 is accommodated). In addition, the second heating unit 280 is configured to heat the members configuring the lower part of the processing container 203, such as the seal cap 219 for sealing the lower end opening of the processing container 203, and the insulator 218 provided to the lower part of the processing container 203, the bottom in the processing container 203. In other words, the second heating unit 280 is disposed to be positioned below the bottom plate 217b when the boat 217 is charged to the processing chamber 201.

The second heating unit 280 is electrically connected to the controller 121 described later. The controller 121 is configured to control the supply power to the second heating unit 280 at predetermined timing to achieve temperature (for example, from 100° C. to 300° C.) to be able to suppress liquefaction of the processing gas (steam) in the processing container 203. Heating of the furnace port part of the processing container 203 by the second heating unit 280 is performed continuously at least while the processing liquid or the processing gas is supplied to the processing container 203. Preferably, the heating is performed from after loading the wafers 200 into the processing container 203 until before unloading. By heating in this way, it is possible to prevent the liquefaction of the processing gas at the furnace port part, and adhesion to the furnace port part of the particles and impurities generated by drying.

(Control Unit)

Figure 3:
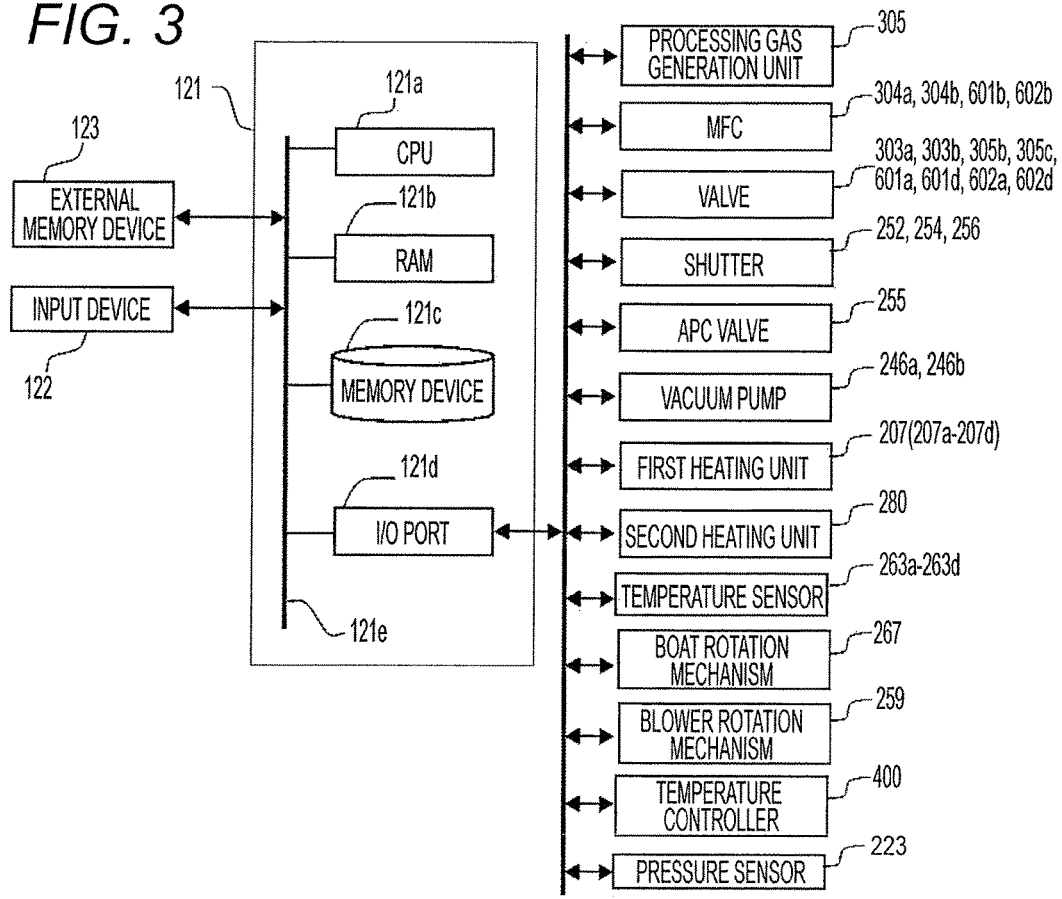
FIG. 3 is a schematic configuration diagram of a controller of the substrate processing apparatus suitably used in the embodiment of the present invention.

As illustrated in FIG. 3, the controller 121 being a control unit (control means) is configured as a computer including a CPU (Central Processing Unit) 121a, RAM (Random Access Memory) 121b, a memory device 121c, an I/O port 121d. The RAM 121b, the memory device 121c, the I/O port 121d are configured to be capable of data exchange with the CPU 121a via an internal bus 121e. The controller 121 is connected to an input/output device 122 configured as, for example, a touch panel.

The memory device 121c is configured by, for example, a flash memory, an HDD (Hard Disk Drive). The memory device 121c readably stores a control program for controlling operation of the substrate processing apparatus, a process recipe in which procedures and conditions of substrate processing described later are described, and the like. Incidentally, a process recipe functions as a program, in which the procedures in the substrate processing described later are combined to be executed by the controller 121 to obtain a certain result. Hereinafter, the process recipe, the control program, and the like are also collectively referred to as, simply, a program. In the present specification, when the term "program is used, it may include the process recipe alone, the control program alone, or both. In addition, the RAM 121b is configured as a memory area (work area) in which the program, data, and the like read by the CPU 121a are temporarily stored.

The I/O port 121d is connected to the above-described processing gas generator 305, MFCs 304a, 304b, 601b, 602b, auto valves 303a, 303b, 305a, 305b, 305c, 601a, 601d, 602a, 602d, shutters 252, 254, 256, APC valve 255, first heating unit 207 (207a, 207b, 207c, 207d), second heating unit 280, blower rotation mechanism 259, first to fourth temperature sensors 263a to 263d, boat rotation mechanism 267, pressure sensor 223, temperature controller 400, and the like.

The CPU 121a is configured to read the control program from the memory device 121c to execute, and to read the process recipe from the memory device 121c depending on input of an operation command from the input/output device 122. The CPU 121a is configured to control, along the content of the process recipe read, various types of operation, such as: processing gas generation operation by the processing gas generator 305; gas flow rate adjustment operation by the MFCs 304a, 304b, 601b, 602b; on-off operation of the auto valves 303a, 303b, 305a, 305b, 305c, 601a, 601d, 602a, 602d; closing operation of the shutters 252, 254, 256; opening and closing adjustment operation of the APC valve 255; and temperature adjusting operation of the first heating unit 207, temperature adjusting operation of the second heating unit 280, start and stop of the vacuum pumps 246a, 246b, rotation speed regulation operation of the blower rotation mechanism 259, rotation speed regulation operation of the boat rotation mechanism 267 based on the first to fourth temperature sensors 263a to 263d.

Incidentally, the controller 121, not limited to a case of being configured as a dedicated computer, can be configured as a general-purpose computer. For example, the controller 121 according to the present embodiment can be configured by preparing an external memory device (for example, magnetic tape, magnetic disk such as flexible disk and hard disk, optical disk such as CD and DVD, magneto-optical disk such as MO, semiconductor memory such as USB memory and memory card) 123 storing the above-described program, and installing the program to the general-purpose computer using the external memory device 123. Incidentally, means of supplying the program to the computer is not limited to a case of supplying via the external memory device 123. For example, the program can be supplied by using communication means such as the Internet and a dedicated line, without intervention of the external memory device 123. Incidentally, the memory device 121c and the external memory device 123 are configured as non-transitory computer-readable recording media. Hereinafter, these are also collectively referred to as, simply, recording media. Incidentally, in the present specification, when the term "non-transitory computer-readable recording medium" is used, it may include the memory device 121c alone, external memory device 123 alone, or both.

(2) Pre-Processing

Figure 4:
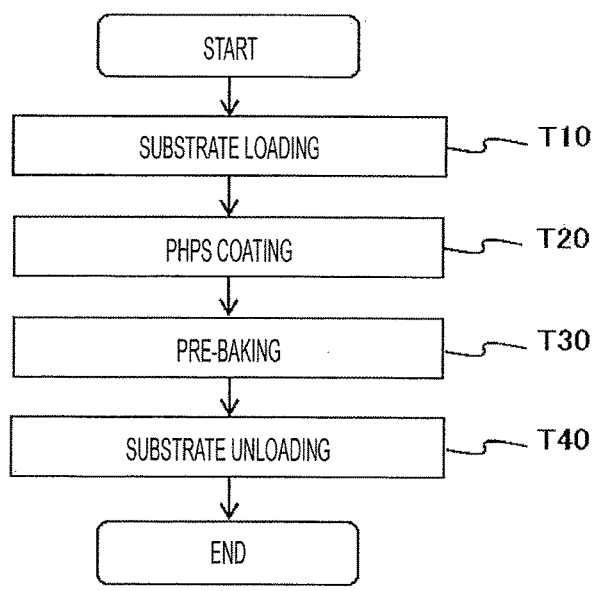
FIG. 4 is a flow diagram illustrating pre-processing of substrate processing according to the embodiment of the present invention.

Here, pre-processing is described with reference to FIG. 4. The wafers 200 as the substrates are subjected to the pre-processing before being subjected to modification processing described later. As illustrated in FIG. 4, the wafers 200 are subjected to PHPS coating T20 and pre-baking T30. In the PHPS coating T20, polysilazane is coated by a coating apparatus (not illustrated). Thickness of the polysilazane coated is adjusted by molecular weight of the polysilazane, viscocity of the polysilazane solution, the number of rotations of a coater. In the pre-baking T30, the solvent is removed from the polysilazane coated on the wafer 200. Specifically, the solvent is volatilized by being heated to a range from about 70° C. to about 250° C. Preferably, it is heated at about 150° C.

In addition, for the wafers 200, substrates are used that has unevenness structure being microstructure, and to which polysilazane ($SiH_2NH$) is supplied to fill at least a recess part (groove), and that has a silicon (Si)-containing film in the groove. An example is described of using steam as the processing gas to the wafers 200. Incidentally, the silicon-containing film contains silicon (Si), nitrogen (N), and hydrogen (H), and may be mixed with carbon (C) or other impurities. Incidentally, the substrate having microstructure is a substrate having high aspect ratio structure, such as a groove (recess part) that is deep in the vertical direction to the silicon substrate, or a groove (recess part) that is narrow in the lateral direction, for example, of a width from about 10 nm to about 30 nm.

(3) Substrate Processing

Figure 5:
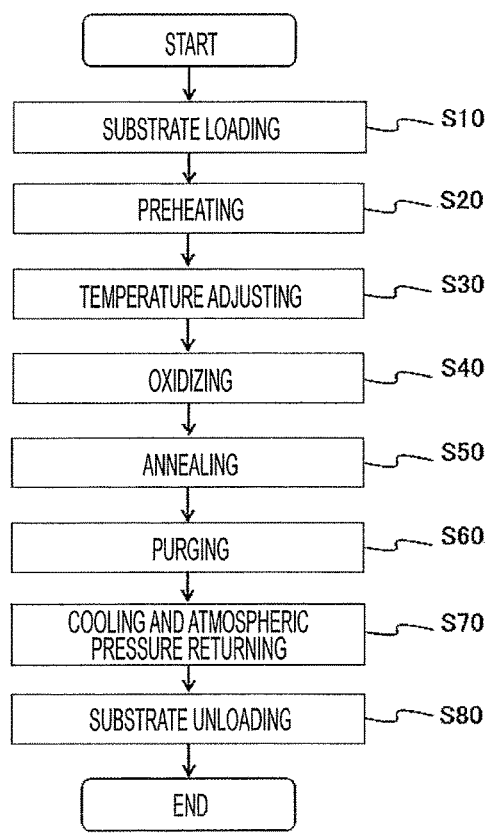
FIG. 5 is a flow diagram illustrating the substrate processing according to the embodiment of the present invention.
Figure 6:
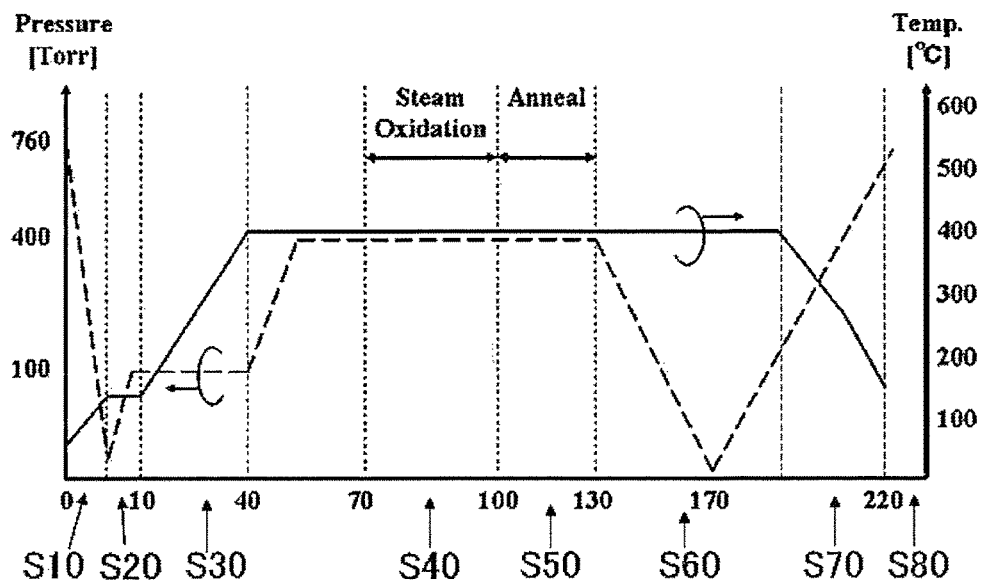
FIG. 6 is a diagram illustrating a timing example of a substrate processing event and temperature according to the embodiment of the present invention.

Next, substrate processing is described that is performed as one process of semiconductor device manufacturing according to the present embodiment, with reference to FIGS. 5, 6. The substrate processing is performed by the above-described substrate processing apparatus. In the present embodiment, as an example of the substrate processing, a case is described in which steam is used as the processing gas, and modifying (oxidizing) the silicon-containing film formed on the wafers 200 as the substrates to a SiO film (modification processing) is performed. In the following description, operation of each part configuring the substrate processing apparatus is controlled by the controller 121.

FIG. 5 is a flow diagram illustrating each process in the present substrate processing. FIG. 6 is a diagram illustrating a timing example of a substrate processing event and temperature in the present substrate processing, and a dashed line in the figure indicates pressure in the processing container 203, and a solid line indicates temperature of the wafers 200 in the processing container 203, and a parameter on the horizontal axis indicates processing time (minutes).

(Substrate Loading (S10))

First, pre-specified number of wafers 200 are charged to the boat 217 (wafer charge). The boat 217 holding the multiple wafers 200 is lifted by the boat elevator to be loaded into the processing container (reaction tube) 203 (into processing chamber 201) (boat load). In this state, the furnace port being the opening of the processing furnace 202 is in a state of being sealed by the seal cap 219. After that, the inside of the processing container 203 is vacuum-exhausted by at least one of the vacuum pump 246a or the vacuum pump 246b to achieve a desired pressure (degree of vacuum). At this time, the pressure in the processing container 203 is measured by the pressure sensor 223, and based on the pressure measured, feedback control is performed to the opening of the APC valve 255 or on-off of the valve 240 (pressure adjustment). In addition, to achieve a desired temperature (for example, about 150° C.) of the wafers 200 in the processing container 203, based on temperature information detected by the first temperature sensor 263a, second temperature sensor 263b, third temperature sensor 263c, fourth temperature sensor 263d, feedback control is performed to the supply power to the first heater unit 207a, second heater unit 207b, third heater unit 207c, fourth heater unit 207d included in the first heating unit 207 (temperature adjustment). At this time, setting temperatures of the first heater unit 207a, second heater unit 207b, third heater units 207c, fourth heater units 207d are controlled to be the same temperature.

(Preheating (S20))

After the pressure in the processing container 203 reaches a predetermined pressure, and the temperature of the wafers 200 reaches a predetermined temperature, oxygen (O)-containing gas is supplied into the processing container 203, and the pressure is adjusted to be about 100 Torr. The predetermined temperature is a first temperature not higher than the temperature of the above-described pre-baking T30. Specifically, the valves 602a, 602d are opened, and the oxygen-containing gas whose flow rate is adjusted by the MFC 602b is supplied into the processing container 203, and the pressure is adjusted by the APC valve 255 and the pressure sensor 223. A flow rate of the oxygen-containing gas is set to, for example, a range from 5 slm to 15 slm. For the oxygen-containing gas, oxygen ($O_2$) gas, ozone ($O_3$) gas, nitric oxide (NO) gas, nitrous oxide ($N_2O$) are used, and suitably, the oxygen gas is used. In the present embodiment, the oxygen gas is used. The predetermined temperature at this time is preferably kept to be the temperature of the above-described pre-baking T30 or lower. In addition, the predetermined temperature at this time has to be at least a temperature required to change the skeletal structure of low molecular weight polysilazane to silicon oxide (Si—O) or higher (for example, 70° C. or higher). After a predetermined time, temperature adjusting S30 is performed. By adjusting the temperature to be the temperature of the pre-baking T30 or lower, softening of a polysilazane film is suppressed, and the skeletal structure of the low molecular weight polysilazane is changed to the silicon oxide (Si—O) with the oxygen-containing gas, so that generation of the particles can be suppressed.

Incidentally, while the wafers 200 are heated, the boat rotation mechanism 267 is operated, and then the rotation of the boat 217 is started. At this time, the rotation speed of the boat 217 is controlled by the controller 121. Incidentally, the boat 217 is always in a state of being rotated at least until oxidizing (S40) described later is completed.

(Temperature Adjusting (S30))

After the preheating S20, while the pressure in the processing container 203 is kept at about 100 Torr, the temperature of the wafers 200 is raised to a second temperature in an oxygen-containing atmosphere. The second temperature is in a range from 250° C. to 450° C., and is, for example, 400° C. In addition, after the temperature reaches 400° C., the pressure in the processing container 203 is increased by increasing the flow rate of the oxygen-containing gas, and is kept at about 400 Torr. In addition, pressure and temperature are kept for a predetermined time until the pressure and temperature are stabilized.

(Oxidizing (S40))

After the temperature of the wafers 200 is stabilized at 400° C., supply of steam ($H_2O$ gas) as the processing gas into the processing container 203 is started. Specifically, the oxygen-containing gas and the hydrogen-containing gas are supplied to the processing gas generator 305, and oxygen and hydrogen are reacted with each other, and then steam is generated. Incidentally, the flow rates of the oxygen-containing gas and the hydrogen-containing gas are adjusted by the MFC 304a and the MFC 304b so that a gas supply ratio ($O_2/H_2$) between the oxygen-containing gas ($O_2$ gas) and the hydrogen-containing gas ($H_2$ gas) becomes 2:3, and a steam concentration becomes 60%. Oxidizing processing is performed for about 30 minutes in a state of supplying the steam to oxidize the polysilazane film (oxidizing). While the oxidizing processing is performed, the oxygen-containing gas (in the present embodiment, oxygen gas) is continuously supplied to the processing container 203 from the oxygen-containing gas supply unit 602. The temperature of the wafers 200 has to be a predetermined temperature or higher (for example, 250° C. or higher) to oxidize the polysilazane film with the steam, and is preferably a predetermined temperature or lower (for example, 400° C. or lower) to avoid hardening of the upper part of the polysilazane film.

(Annealing (S50))

In the oxidizing S40, after a predetermined time, annealing can be performed for a predetermined time (for example, for 30 minutes) to the silicon oxide film formed on the wafers 200 by stopping supply of the oxygen gas and supply of the steam into the processing container 203, and supplying nitrogen-containing gas into the processing container 203 while keeping the temperature of the wafers 200. Here, the nitrogen-containing gas is, for example, nitrogen ($N_2$) gas, and can be supplied from the purge gas supply unit 601.

(Purging (S60))

After the annealing S50 is completed, while the temperature of the wafers 200 is kept, the inside of the processing container 203 is exhausted until the pressure becomes a predetermined pressure. For example, it is exhausted until the pressure becomes about 1 Torr. After the pressure reaches the predetermined pressure, supply is started of nitrogen gas as inert gas into the processing container 203, and the nitrogen gas is supplied until the pressure becomes the predetermined pressure. In this way, the particles and the impurities can be removed by exhausting the inside of the processing container 203 to reduce the pressure while keeping the temperature of the wafers 200. In addition, the particles, impurities, and outgas from the wafers 200 can be removed that have not been removed by vacuum exhaust and remains in the processing container 203, by supplying the inert gas while keeping the temperature of the wafers 200 after the exhaust.

(Cooling and Atmospheric Pressure Returning (S70))

After the pressure in the processing container 203 reaches the predetermined pressure, cooling of the wafers 200 is started. For example, when the pressure in the processing container 203 becomes about 100 Torr or higher, the cooling of the wafers 200 is started.

Cooling gas can be supplied into a space 260 between the processing container 203 and the heat insulation member 210 while the flow rate of the cooling gas is controlled by a mass flow controller 251, from a cooling gas supply pipe 249, when the shutters 252, 254, 256 are opened in a state of operation of a blower 257 while the wafers 200 are cooled, and, simultaneously, the cooling gas can be exhausted from a cooling gas exhaust pipe 253. As the cooling gas, other than the $N_2$ gas, for example, air and the rare gas, such as He gas, Ne gas, Ar gas, can be used alone or in combination. Thus, the inside of the space 260 can be quickly cooled, and the first heating unit 207 and the processing container 203 provided in the space 260 can be cooled in a short time. In addition, the wafers 200 in the processing container 203 can be cooled in a shorter time.

Incidentally, the $N_2$ gas can be supplied into the space 260 from the cooling gas supply pipe 249 in a state of closing of the shutters 254, 256, and the inside of the space 260 is filled with the cooling gas to be cooled, and then the shutters 254, 256 are opened in a state of operation of the blower 257, and the cooling gas in the space 260 can be exhausted from the cooling gas exhaust pipe 253.

(Substrate Unloading (S80))

After that, the seal cap 219 is lowered by the boat elevator to open the lower end of the processing container 203, and the wafers 200 processed, in a state of being held by the boat 217, are unloaded to the outside of the processing container 203 (processing chamber 201) from the lower end of the processing container 203 (boat unload). After that, the wafers 200 processed are taken out from the boat 217 (wafer discharge), and the substrate processing according to the present embodiment is completed.

(4) Effects According to the Present Embodiment

According to the present embodiment, one or more effects described below are obtained.

(a) In the preheating, by heating at the temperature of the pre-baking or lower, softening of the low molecular weight polysilazane can be prevented, and the number of particles can be reduced.

(b) In addition, by performing the preheating in the oxygen-containing atmosphere, the skeletal structure of the low molecular weight polysilazane can be changed to the silicon oxide (Si—O), and separation of the low molecular weight polysilazane can be suppressed and generation of the particles can be suppressed.

Figure 7:
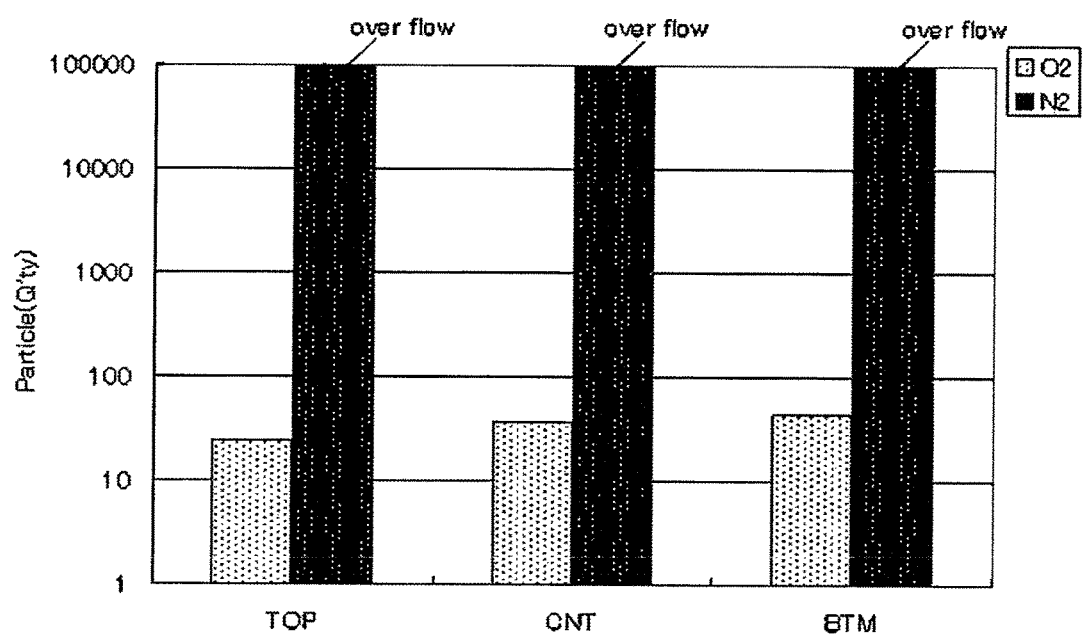
FIG. 7 is a diagram illustrating comparison of an amount of foreign matter on a substrate surface according to the embodiment of the present invention.

(c) In addition, by performing the preheating in an oxygen gas ($O_2$) atmosphere, generation of the particles can be suppressed. In FIG. 7, a diagram is illustrated comparing the number of particles generated when the preheating is performed in the oxygen gas atmosphere and the number of particles generated when the preheating is performed in a nitrogen gas ($N_2$) atmosphere. As illustrated in FIG. 7, it can be seen that a case of processing in the oxygen gas atmosphere, in comparison with a case of processing in the nitrogen gas atmosphere, is able to significantly suppress the number of particles.

(d) In addition, when the preheating is performed at the pre-baking temperature of the polysilazane film formed on the wafers 200 or lower, the polysilazane can be uniformly subjected to oxidizing. For example, when the pre-heating is performed at higher than the pre-baking temperature, the upper part of the polysilazane is hardened that is embedded in the unevenness formed on the wafers 200, and in the later oxidizing, a case may occur in which uniform oxidizing to the bottom of the unevenness cannot be performed; however, by keeping the temperature at the pre-baking temperature or lower, hardening of the upper part of the polysilazane can be suppressed.

Other Embodiment of the Present Invention

The embodiment of the present invention has been specifically described above; however, the present invention is not limited to the above-described embodiment, and can be variously modified without departing from the scope of the invention.

In the above-described embodiment, although the case has been described in which steam is used as the processing gas, the present invention is not limited thereto. That is, the processing gas can be oxidizing gas vaporized from solution (reactant in the liquid state) in which a source (reactant) being solid or liquid at normal temperature is dissolved in a solvent. For example, hydrogen peroxide solution can be used in which hydrogen peroxide ($H_2O_2$) is dissolved in water ($H_2O$). By supplying gas containing the hydrogen peroxide vaporized from the hydrogen peroxide solution to the wafers 200 to perform oxidizing processing, oxidizing of the polysilazane film can be performed at a lower temperature. For example, the oxidizing can be performed at a range from about 70° C. to about 130° C. Further, by the lower temperature, when the unevenness is formed on the wafers 200, more uniform oxidizing can be performed to the bottom of the recess part. For example, a case may occur in which polysilazane of the upper part of the recess part is hardened and the processing does not proceed to the bottom of the recess part when heated to about 400° C. as the above-described embodiment. The hydrogen peroxide, in comparison with steam (water, $H_2O$), has a feature that the activation energy is high, and the oxidizing power is strong since a large number of oxygen atoms are contained in one molecule. Therefore, when hydrogen peroxide gas is used, it is advantageous in that an oxygen atom (O) can reach a deep part (bottom of groove) of the film formed in the groove of the wafers 200.

In addition, not limited to the case in which steam and hydrogen peroxide gas are used as the processing gas, for example, steam generated by heating water ($H_2O$) can be used. In addition, as the oxygen-containing gas, other than $O_2$ gas, for example, ozone ($O_3$) gas and steam ($H_2O$) can be used. In addition, performance deterioration can be suppressed of circuits formed on the wafers 200, in particular, circuits using material easily affected by high temperature processing (for example, aluminum).

Incidentally, the steam (water in the gas state) as the processing gas can include a state of a $H_2O$ molecule alone, and a cluster state in which several molecules are bonded together. In addition, when water ($H_2O$) is made to be the gas state from the liquid state, it can be divided into a $H_2O$ molecule alone, and can be divided into a cluster state in which several molecules are bonded together. In addition, it can be a mist state made by the above-mentioned several clusters gathered.

In addition, when the hydrogen peroxide gas is used as the above-described processing gas, similarly, the hydrogen peroxide gas can include a state of a $H_2O_2$ molecule alone, and a cluster state in which several molecules are bonded together. In addition, when the hydrogen peroxide solution ($H_2O_2$) is vaporized to the hydrogen peroxide gas, it can be divided into a $H_2O_2$ molecule alone, and can be divided into a cluster state in which several molecules are bonded together. In addition, it can be a mist state made by the above-mentioned several clusters gathered.

In addition, in the above-described embodiment, although the example has been shown of processing the wafer 200 on which the polysilazane film is formed, the present invention is not limited thereto. For example, by processing the wafer 200 on which a film having a silazane bond (—Si—N—) is formed, the same effect can be obtained.

In addition, in the above, although the example has been shown of processing the wafer 200 on which a film having a silazane bond is spin-coated, the present invention is not limited thereto, and oxidizing can be similarly performed also to a silicon-containing film formed by a Chemical Vapor Deposition (CVD) method.

In the above-described processing furnace 202, outside the processing container 203, as a temperature detector for detecting each temperature of the first heater unit 207a, second heater unit 207b, third heater unit 207c, fourth heater unit 207d included in the first heating unit 207, for example, a first external temperature sensor 264a, second external temperature sensor 264b, third external temperature sensor 264c, fourth external temperature sensor 264d of thermocouple and the like (see FIG. 2) can be installed. The first external temperature sensor 264a, second external temperature sensor 264b, third external temperature sensor 264c, fourth external temperature sensor 264d are each connected to the controller 121. Thus, based on the temperature information detected by each of the first external temperature sensor 264a, second external temperature sensor 264b, third external temperature sensor 264c, fourth external temperature sensor 264d, it can be monitored whether or not each temperature of the first heater unit 207a, second heater unit 207b, third heater unit 207c, fourth heater unit 207d is heated to a predetermined temperature.

In the above-described embodiment, although the substrate processing apparatus including the vertical type processing furnace has been described, the present invention, not limited thereto, can be suitably applied to, for example, a substrate processing apparatus including single-wafer, Hot Wall type, Cold Wall type processing furnace, and a substrate processing apparatus configured to process the wafer 200 by exciting the processing gas.

PREFERRED ASPECT OF THE PRESENT INVENTION

Hereinafter, several aspects are supplementary noted.

Supplementary Note 1

According to one aspect, provided is a method of manufacturing a semiconductor device including: loading a substrate into a processing container, the substrate being provided with a film having a silazane bond and being subjected to pre-baking; supplying oxygen-containing gas to the substrate at a first temperature not higher than the temperature of the pre-baking; and supplying processing gas to the substrate at a second temperature higher than the first temperature.

Supplementary Note 2

Provided is the method of manufacturing a semiconductor device according to Supplementary Note 1, and, preferably, the film having the silazane bond is a film containing a low molecular weight polysilazane.

Supplementary Note 3

Provided is the method of manufacturing a semiconductor device according to Supplementary Notes 1 to 2, and, preferably, the oxygen-containing gas is gas containing oxygen gas, and the processing gas is gas containing steam.

Supplementary Note 4

Provided is the method of manufacturing a semiconductor device according to any one of Supplementary Notes 1 to 3, and, preferably, the supplying the processing gas is performed after the supplying the oxygen-containing gas, and the processing gas is supplied while the oxygen-containing gas is supplied, in the supplying the processing gas.

Supplementary Note 5

Provided is the method of manufacturing a semiconductor device according to Supplementary Note 4, preferably, including annealing in which supply of the processing gas and the oxygen-containing gas is stopped and nitrogen-containing gas is supplied, after the supplying the processing gas.

Supplementary Note 6

Provided is the method of manufacturing a semiconductor device according to Supplementary Notes 1 to 5, preferably, including exhausting the inside of the processing container while keeping the temperature of the substrate, after the supplying the processing gas.

Supplementary Note 7

Provided is the method of manufacturing a semiconductor device according to Supplementary Note 6, preferably, including cooling the substrate after supplying inert gas into the processing container to adjust to a predetermined pressure, after the exhausting the inside of the processing container.

Supplementary Note 8

According to the other aspect, provided is a substrate processing apparatus including: a processing container configured to accommodate a substrate being provided with a film having a silazane bond and being subjected to pre-baking; an oxygen-containing gas supply unit configured to supply oxygen-containing gas to the substrate; gas supply unit configured to supply processing gas to the substrate; a heating unit configured to heat the substrate; and a control unit configured to heat the substrate to a first temperature not higher than the temperature of the pre-baking in a state of supplying the oxygen-containing gas, and to control the oxygen-containing gas supply unit, the gas supply unit, and the heating unit to heat the substrate at a second temperature higher than the first temperature in a state of supplying the processing gas.

Supplementary Note 9

Provided is the substrate processing apparatus according to Supplementary Note 8, preferably, including an exhaust unit configured to exhaust the atmosphere in the processing container, and the control unit controls the gas supply unit, the heating unit, and the exhaust unit to exhaust the atmosphere in the processing container in a state of keeping the temperature of the substrate at the second temperature, after heating at the second temperature in the state of supplying the processing gas.

Supplementary Note 10

Provided is the substrate processing apparatus according to Supplementary Note 9, and, preferably, the control unit controls the gas supply unit, the exhaust unit, and the heating unit so that the gas supply unit supplies the inert gas into the processing container to increase the pressure in the processing container in the state of keeping the temperature of the substrate at the second temperature, after the exhaust.

Supplementary Note 11

Provided is the substrate processing apparatus according to any one of Supplementary Notes 8 to 10, and, preferably, the first temperature is 150° C. or lower, and the second temperature is in a range from 250° C. to 400° C.

Supplementary Note 12

Provided is the substrate processing apparatus according to any one of Supplementary Notes 8 to 11, and, preferably, the oxygen-containing gas is a gas containing oxygen gas, and the processing gas is a gas containing steam.

Supplementary Note 13

According to yet another aspect, provided is a program to be executed by a computer, or a non-transitory computer-readable recording medium recording the program, the program including the procedures of: loading a substrate to a processing container, the substrate being provided with a film having a silazane bond and being subjected to pre-baking; supplying oxygen-containing gas to the substrate at a first temperature not higher than the temperature of the pre-baking; and supplying processing gas to the substrate at a second temperature higher than the first temperature.

Supplementary Note 14

Provided is the program, or the non-transitory computer-readable recording medium recording the program according to Supplementary Note 13, and, preferably, the supplying the processing gas at the second temperature is performed after the supplying the oxygen-containing gas.

Supplementary Note 15

Provided is the program, or the non-transitory computer-readable recording medium recording the program according to Supplementary Note 13 or 14, and, preferably, the program includes a procedure in which the supply of the oxygen-containing gas is stopped and nitrogen-containing gas is supplied, after the supplying the processing gas at the second temperature.

Supplementary Note 16

Provided is the program, or the non-transitory computer-readable recording medium recording the program according to any one of Supplementary Notes 13 to 15, and, preferably, the program includes a procedure of exhausting the inside of the processing container while keeping the temperature of the substrate, after the supplying the processing gas.

Supplementary Note 17

Provided is the program, or the non-transitory computer-readable recording medium recording the program according to Supplementary Notes 16, and, preferably, the program includes a procedure of cooling the substrate after supplying the inert gas into the processing container to adjust to a predetermined pressure, after the exhausting the inside of the processing container.

INDUSTRIAL APPLICABILITY

With the technique according to the present invention, manufacturing quality of the semiconductor device can be improved.

REFERENCE SIGNS LIST 200 wafer (substrate)
203 processing container (reaction tube)
217 boat
219 seal cap
207 first heating unit
280 second heating unit
300 liquid flow rate control unit
501 processing gas supply nozzle
502 supply hole
231 gas exhaust pipe
121 controller (control unit)

The invention claimed is:

1. A method of manufacturing a semiconductor device comprising:
    loading a substrate into a processing container, the substrate being provided with a film having a silazane bond, the film being subjected to pre-baking;
    supplying oxygen-containing gas to the substrate at a first temperature not higher than a temperature of the pre-baking; and
    supplying processing gas containing at least any one of steam or hydrogen peroxide to the substrate at a second temperature higher than the first temperature, where supplying processing gas is performed after supplying oxygen-containing gas; and
    annealing in which supply of the processing gas and the oxygen-containing gas is stopped and nitrogen-containing gas is supplied, after the supplying processing gas.

2. The method of manufacturing a semiconductor device according to claim 1, wherein the oxygen-containing gas contains at least one of oxygen gas, ozone gas, nitric oxide gas and nitrous oxide gas.

3. The method of manufacturing a semiconductor device according to claim 2, wherein the film having the silazane bond is a film containing a silazane bond of a low molecular weight, and the oxygen-containing gas is supplied to the substrate to change skeletal structure of the silazane bond of the low molecular weight to silicon oxide, in the supplying the oxygen-containing gas.

4. The method of manufacturing a semiconductor device according to claim 1, wherein the oxygen-containing gas is supplied to the substrate to change skeletal structure of the silazane bond to silicon oxide, in supplying oxygen-containing gas.

5. The method of manufacturing a semiconductor device according to claim 1, including exhausting the inside of the processing container while keeping the temperature of the substrate, after the supplying the processing gas.

6. The method of manufacturing a semiconductor device according to claim 5, including cooling the substrate after supplying inert gas into the processing container while keeping the temperature of the substrate until a pressure of the inside of the processing container reaches a predetermined pressure, after the exhausting the inside of the processing container.

7. The method of manufacturing a semiconductor device according to claim 1, wherein the first temperature is 150° C. or lower, and the second temperature is in a range from 250° C. to 400° C.

8. The method of manufacturing a semiconductor device according to claim 1, wherein the film having the silazane bond is a film containing a silazane bond of a low molecular weight, and skeletal structure of the silazane bond of the low molecular weight is changed to silicon oxide, in the supplying the oxygen-containing gas.

9. The method of manufacturing a semiconductor device according to claim 1, wherein the film having the silazane bond is a film formed by a CVD method.

10. A non-transitory computer-readable recording medium configured to record a program to be executed by a computer, the program including procedures of:
    loading a substrate into a processing container, the substrate being provided with a film having a silazane bond, the film being subjected to pre-baking;
    supplying oxygen-containing gas to the substrate at a first temperature not higher than a temperature of the pre-baking; and
    supplying processing gas containing at least any one of steam or hydrogen peroxide to the substrate at a second temperature higher than the first temperature, where supplying processing gas is performed after supplying oxygen-containing gas; and
    annealing in which supply of the processing gas and the oxygen-containing gas is stopped and nitrogen-containing gas is supplied, after supplying processing gas.

11. A method of manufacturing a semiconductor device comprising:
    loading a substrate into a processing container, the substrate being provided with a film having a silazane bond, the film being subjected to pre-baking;
    supplying oxygen-containing gas to the substrate at a first temperature not higher than a temperature of the pre-baking; and
    supplying processing gas containing at least any one of steam or hydrogen peroxide to the substrate at a second temperature higher than the first temperature;
    exhausting the inside of the processing container while keeping the temperature of the substrate, after supplying processing gas; and
    cooling the substrate after supplying inert gas into the processing container while keeping the temperature of the substrate until a pressure of the inside of the processing container reaches a predetermined pressure, after exhausting the inside of the processing container.

* * * * *